(12) United States Patent
Vella-Coleiro et al.

(10) Patent No.: US 8,965,454 B2
(45) Date of Patent: Feb. 24, 2015

(54) AMPLIFIER SYSTEM FOR CELL SITES AND OTHER SUITABLE APPLICATIONS

(75) Inventors: George P. Vella-Coleiro, Summit, NJ (US); Josef Ocenasek, Whippany, NJ (US); Jeffrey G. Strahler, Grove City, OH (US); Christopher F. Zappala, Annandale, NJ (US)

(73) Assignee: Andrew LLC, Hickory, NC (US)

( * ) Notice: Subject to any disclaimer, the term of this patent is extended or adjusted under 35 U.S.C. 154(b) by 1075 days.

(21) Appl. No.: 12/397,491

(22) Filed: Mar. 4, 2009

(65) Prior Publication Data
US 2010/0227599 A1 Sep. 9, 2010

(51) Int. Cl.
| | |
|---|---|
| *H04M 1/00* | (2006.01) |
| *H04B 1/04* | (2006.01) |
| *H04B 17/00* | (2006.01) |
| *H04B 1/02* | (2006.01) |
| *H04B 7/14* | (2006.01) |
| *H04L 25/49* | (2006.01) |
| *H04L 25/03* | (2006.01) |

(Continued)

(52) U.S. Cl.
CPC ............... *H03F 3/602* (2013.01); *H01P 1/213* (2013.01); *H03F 1/3223* (2013.01); *H03F 3/19* (2013.01); *H03F 3/245* (2013.01); *H03F 2200/111* (2013.01); *H03F 2200/192* (2013.01); *H03F 2200/198* (2013.01); *H03F 2200/204* (2013.01); *H03F 2200/451* (2013.01); *H04B 1/0064* (2013.01)
USPC ..................... 455/561; 455/114.1; 455/114.2; 455/114.3; 455/115.2; 455/91; 455/24; 455/63.1; 455/126; 455/127.4; 455/144; 375/294; 375/295; 375/296; 375/297; 330/151; 330/149; 330/84; 330/85

(58) Field of Classification Search
CPC ............................ H03F 1/3229; H03F 1/3247
USPC ............ 455/561, 114.1–114.3, 115.2, 91, 24, 455/63.1, 126, 127.4, 144, 194.2; 375/294–297; 330/151, 149, 84, 85
See application file for complete search history.

(56) References Cited

U.S. PATENT DOCUMENTS 3,571,742 A 3/1971 Wengenroth ..................... 330/54
3,789,314 A 1/1974 Beurrier
(Continued)

OTHER PUBLICATIONS

International Search Report and Written Opinion received in PCT/US2010/024639 mailing date Oct. 4, 2010.
(Continued)

*Primary Examiner* — Dung Hong
(74) *Attorney, Agent, or Firm* — Mendelsohn, Drucker & Dunleavy, P.C.; Steve Mendelsohn (57) ABSTRACT

In one embodiment, an amplifier system has a tap, a delay filter, a linearized amplifier, and a hybrid combiner. The tapped portion of an input signal is amplified by the amplifier, the untapped portion of the input signal is delayed by the delay filter, and the combiner combines the resulting amplified, tapped portion and the delayed, untapped portion to generate an amplified output signal. By re-combining the delayed, untapped portion of the input signal with the amplified, tapped portion, the power of the untapped portion is not lost, and the amplifier does not have to compensate for all of the distortion that would otherwise be associated with the total output power level. Such an amplifier system is applicable, for example, in upgrading an existing GSM cell site to support both GSM communications as well as UMTS communications without degrading GSM operations.

18 Claims, 6 Drawing Sheets

(51) Int. Cl.
  *H04L 27/00* (2006.01)
  *H03F 1/30* (2006.01)
  *H03F 3/68* (2006.01)
  *H03F 3/60* (2006.01)
  *H01P 1/213* (2006.01)
  *H03F 1/32* (2006.01)
  *H03F 3/19* (2006.01)
  *H03F 3/24* (2006.01)
  *H04B 1/00* (2006.01)

(56) References Cited

U.S. PATENT DOCUMENTS

| | | | | |
|---|---|---|---|---|
| 4,380,738 A * | 4/1983 | Wagner | | 330/151 |
| 5,304,945 A | 4/1994 | Myer | | |
| 5,745,839 A * | 4/1998 | Lieberman | | 455/10 |
| 5,917,375 A * | 6/1999 | Lisco et al. | | 330/151 |
| 5,930,374 A * | 7/1999 | Werrbach et al. | | 381/99 |
| 6,384,680 B1 * | 5/2002 | Takei et al. | | 330/124 R |
| 6,397,090 B1 * | 5/2002 | Cho | | 455/574 |
| 6,433,640 B1 | 8/2002 | Pavio et al. | | 330/295 |
| 6,801,788 B1 | 10/2004 | Csapo et al. | | 455/561 |
| 7,346,323 B2 | 3/2008 | Ahonpää | | 455/272 |
| 2002/0041210 A1 | 4/2002 | Booth et al. | | |
| 2002/0049044 A1 * | 4/2002 | Indseth | | 455/118 |
| 2002/0125948 A1 * | 9/2002 | Haigh et al. | | 330/151 |
| 2004/0113716 A1 * | 6/2004 | Hilal et al. | | 333/109 |
| 2005/0026574 A1 * | 2/2005 | Ocenasek et al. | | 455/126 |
| 2005/0175185 A1 | 8/2005 | Korner | | |
| 2006/0217083 A1 | 9/2006 | Braithwaite | | |
| 2006/0273853 A1 * | 12/2006 | Suzuki et al. | | 330/151 |
| 2009/0061938 A1 * | 3/2009 | Ulbricht et al. | | 455/561 |
| 2011/0092171 A1 * | 4/2011 | Delforce | | 455/90.2 |

OTHER PUBLICATIONS

European Search Report; Mailed Sep. 11, 2012 for corresponding EP Application No. EP 10 74 9103.

* cited by examiner

AMPLIFIER SYSTEM FOR CELL SITES AND OTHER SUITABLE APPLICATIONS

BACKGROUND OF THE INVENTION

1. Field of the Invention

The present invention relates to electronics and, in particular, to amplifier systems and interface units for cell sites for wireless communications systems.

2. Description of the Related Art

It is desirable, in certain circumstances, to upgrade a cell site in an existing wireless communications system conforming to the Global System for Mobile communications (GSM) standard to support communications conforming to other wireless communications standards, such as the Universal Mobile Telecommunications System (UMTS) standard, while continuing to support communications conforming to the GSM standard. In addition, it may be desirable to do so in a manner that does not increase the number of antennas in the cell site. It may also be desirable to do so in a manner that does not significantly degrade the transmitted power of the GSM downlink signals or the receiver sensitivity to the GSM uplink signals.

For example, a conventional GSM-only cell site may be configured with two antennas and a GSM base station having two GSM transceivers, where each base station transceiver is connected to a different antenna for both downlink and uplink signal processing and the diversity receive signal is derived from the other antenna inside the GSM base station. A UMTS base station can be added to such a cell site to upgrade the cell site to support both GSM and UMTS communications. One issue is how to handle the different GSM and UMTS downlink and uplink signals without increasing the number of antennas.

SUMMARY OF THE INVENTION

In one embodiment, the present invention is an apparatus having an amplifier system comprising a tap, a delay filter, an amplifier, and a combiner. The tap is adapted to split an amplifier input signal into a tapped signal and an untapped signal. The delay filter is adapted to delay the untapped signal to generate a delayed signal. The amplifier is adapted to amplify the tapped signal to generate an amplified signal. The combiner is adapted to combine the delayed signal and the amplified signal to generate an amplifier output signal.

In another embodiment, the present invention is a method for upgrading an existing cell site that supports communications of two different sets of downlink/uplink signals to be an upgraded cell site that supports communications of at least three different sets of downlink/uplink signals, wherein the existing cell site applies (i) a first downlink signal to a first antenna of the existing cell site and (ii) a second downlink signal to a second antenna of the existing cell site. The cell site is configured (a) to generate a third downlink signal and (b) with an interface unit. The interface unit comprises a combiner and an amplifier system. The combiner is adapted to combine two of the downlink signals to generate a combined downlink signal. The amplifier system is adapted to amplify the combined downlink signal to generate an amplified combined downlink signal. The interface unit is connected to apply (i) the amplified combined downlink signal to the first antenna and (ii) a remaining downlink signal to the second antenna.

In yet another embodiment, the present invention is a cell site comprising an interface unit connected to one or more BTSs and at least first and second antennas. The interface unit comprises a combiner and an amplifier system. The combiner is adapted to combine first and second downlink signals received from the one or more BTSs to generate a combined downlink signal. The amplifier system is adapted to amplify the combined downlink signal to generate an amplified combined downlink signal. The interface unit is connected to apply (i) the amplified combined downlink signal to the first antenna and (ii) a third downlink signal received from the one or more BTSs to the second antenna.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
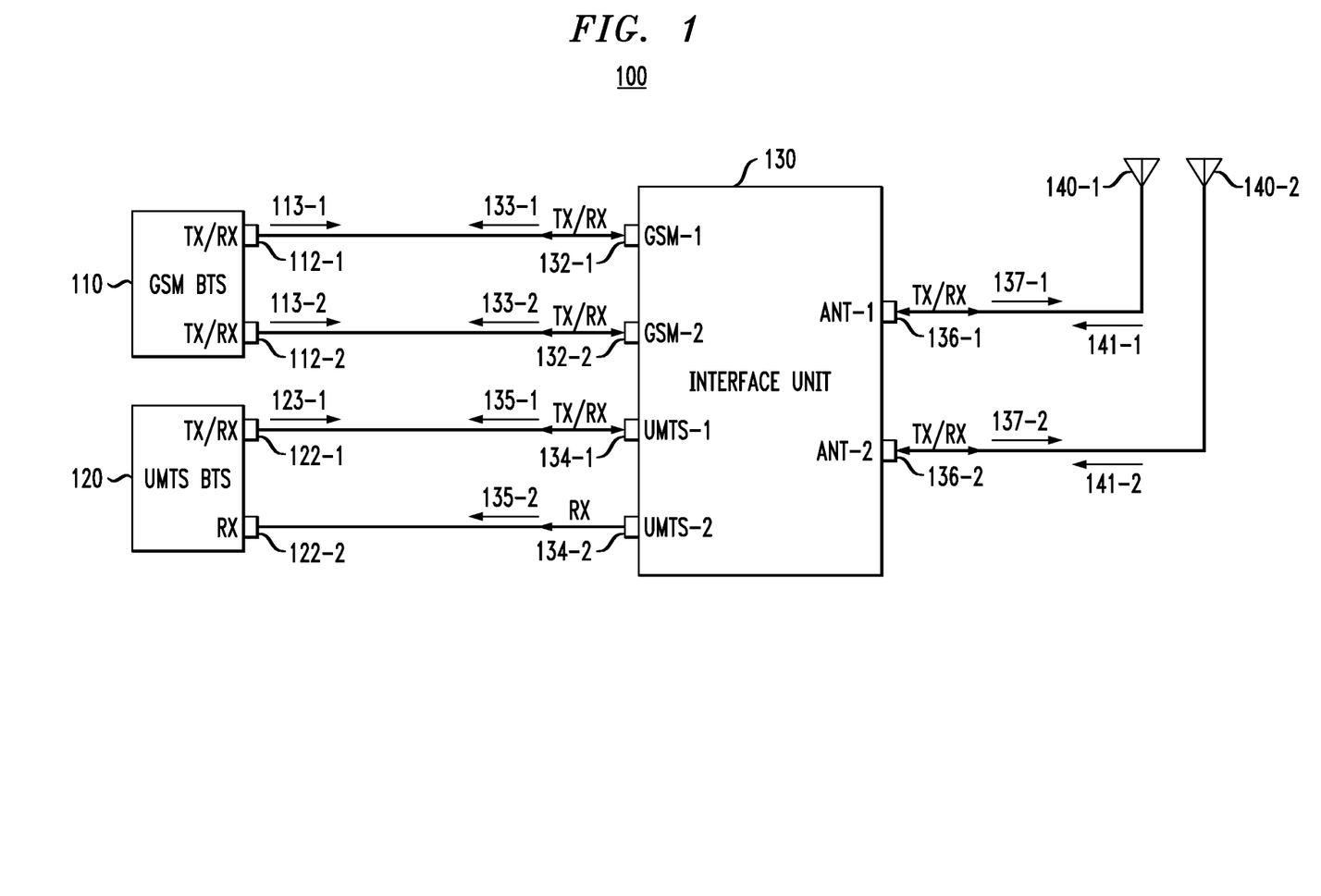
FIG. 1 shows a simplified block diagram of a cell site that can handle wireless communications conforming to the GSM standard as well as wireless communications conforming to the UMTS standard, according to one embodiment of the present invention.

FIG. 1 shows a simplified block diagram of a cell site 100 that can handle wireless communications conforming to the GSM standard as well as wireless communications conforming to the UMTS standard, according to one embodiment of the present invention. Depending on the implementation, cell site 100 may be the result of upgrading an existing GSM-only cell site or cell site 100 may be a newly configured cell site. As shown in FIG. 1, cell site 100 has a GSM base transceiver station (BTS) 110 and a UMTS BTS 120, both of which are coupled to two antennas 140-1 and 140-2 via an interface unit 130.

In particular, interface unit 130 has two GSM BTS ports 132-1 and 132-2, which are coupled to two I/O ports 112-1 and 112-2, respectively, of GSM BTS 110. Interface unit 130 also has two UMTS BTS ports 134-1 and 134-2, which are coupled to two I/O ports 122-1 and 122-2, respectively, of UMTS BTS 120. In addition, interface unit 130 has two antenna ports 136-1 and 136-2, which are coupled to the two antennas 140-1 and 140-2, respectively.

Operationally, in the downlink direction, GSM BTS 110 generates and, respectively, applies two GSM downlink signals 113-1 and 113-2 to its I/O ports 112-1 and 112-2 for transmission to BTS ports 132-1 and 132-2 of interface unit 130. At the same time, UMTS BTS 120 generates and applies a single UMTS downlink signal 123-1 (which consists of one or more UMTS carriers) to its I/O port 122-1 for transmission to UMTS BTS port 134-1 of interface unit 130. Interface unit 130 processes the two GSM downlink signals 113-1 and 113-2 and the single UMTS downlink signal 123-1 to generate and, respectively, apply combined GSM downlink signal 137-1 and UMTS downlink signal 137-2 to its antenna ports 136-1 and 136-2 for transmission to and radiation by antennas 140-1 and 140-2.

At the same time, in the uplink direction, interface unit 130, respectively, receives combined GSM/UMTS uplink signals 141-1 and 141-2 at its antenna ports 136-1 and 136-2 from antennas 140-1 and 140-2 and processes those combined GSM/UMTS uplink signals to generate and apply (i) GSM uplink signals 133-1 and 133-2 at its GSM BTS ports 132-1 and 132-2 for transmission to I/O ports 112-1 and 112-2 of GSM BTS 110 and (ii) UMTS uplink signals 135-1 and 135-2 at its UMTS BTS ports 134-1 and 134-2 for transmission to I/O ports 122-1 and 122-2 of UMTS BTS 120.

Figure 2:
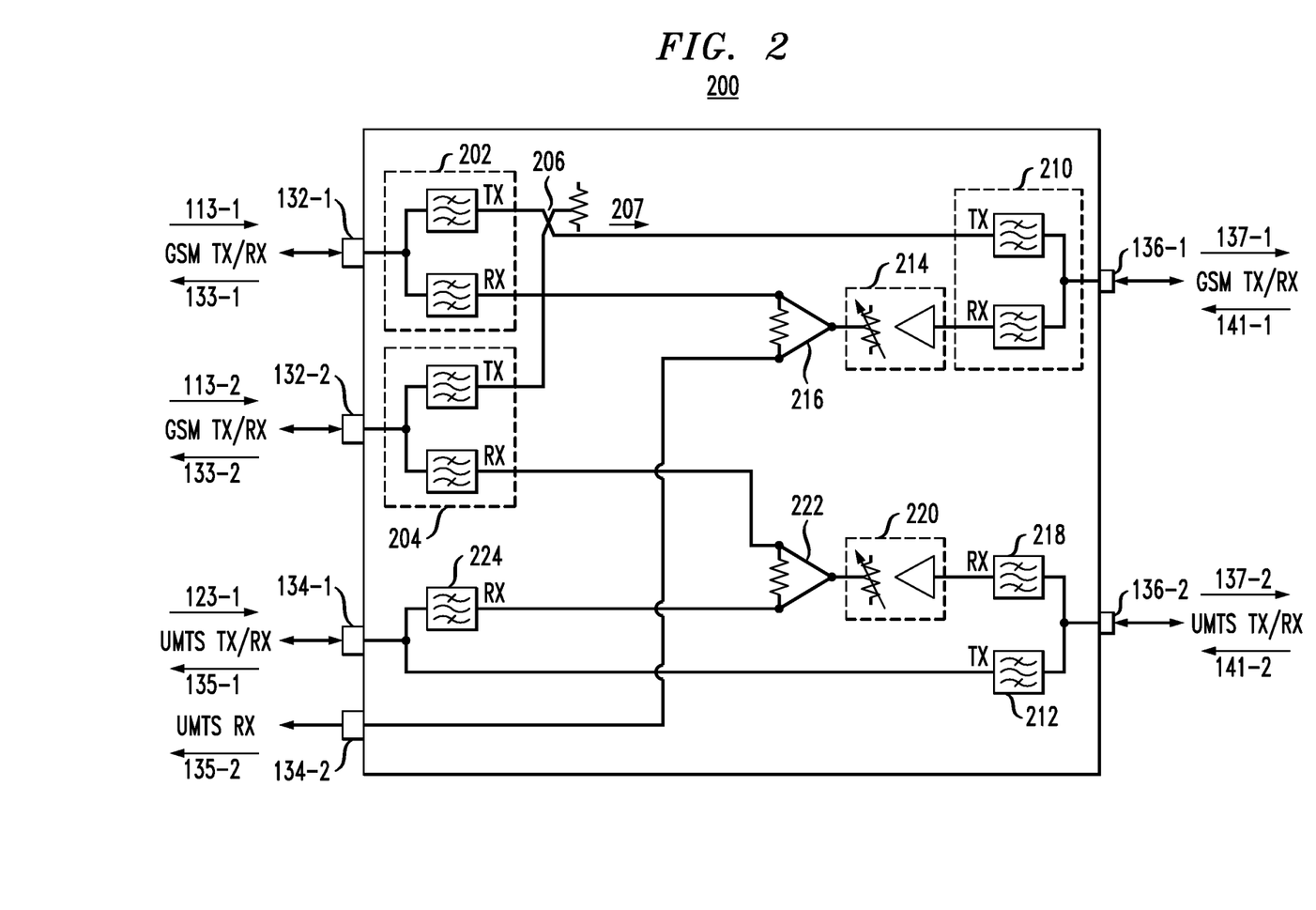
FIG. 2 shows a simplified block diagram of an interface unit that can be used for the interface unit of FIG. 1.

FIG. 2 shows a simplified block diagram of an interface unit 200, which can be used for interface unit 130 of FIG. 1. As shown in FIG. 2, interface unit 200 includes:

First GSM duplexer 202 coupled to GSM BTS port 132-1;
Second GSM duplexer 204 coupled to GSM BTS port 132-2;
UMTS receive (RX) filter 224 coupled to UMTS BTS port 134-1;
UMTS transmit (TX) filter 212 coupled to both UMTS BTS port 134-2 and antenna port 136-2;
Antenna duplexer 210 coupled to antenna port 136-1;
Antenna RX filter 218 coupled to antenna port 136-2;
Hybrid combiner 206 having inputs coupled to the TX output ports of first and second GSM duplexers 202 and 204 and an output coupled to the TX input port of antenna duplexer 210;
First RX amplifier 214 coupled to the RX output port of antenna duplexer 210;
Splitter 216 coupled between (i) the output of first RX amplifier 214 and (ii) both (a) the RX input port of GSM duplexer 202 and (b) UMTS BTS port 134-2;
Second RX amplifier 220 coupled to antenna RX filter 218; and
Splitter 222 coupled between (i) the output of second RX amplifier 220 and (ii) both (a) the RX input port of GSM duplexer 204 and (b) the input of UMTS RX filter 224.

Operationally, in the downlink direction:

First GSM duplexer 202 passes GSM downlink signal 113-1 of FIG. 1 to one input port of hybrid combiner 206;
Second GSM duplexer 204 passes GSM downlink signal 113-2 of FIG. 1 to the other input port of hybrid combiner 206;
Hybrid combiner 206 combines GSM downlink signals 113-1 and 113-2 to generate combined GSM downlink signal 207, which is passed by antenna duplexer 210 to antenna port 136-1 as GSM downlink signal 137-1 of FIG. 1; and
UMTS TX filter 212 passes UMTS downlink signal 123-1 of FIG. 1 to antenna port 136-2 as UMTS downlink signal 137-2.

At the same time, in the uplink direction:

Antenna duplexer 210 passes combined GSM/UMTS uplink signal 141-1 of FIG. 1 to first RX amplifier 214;
The amplified output of first RX amplifier 214 is split by splitter 216 and the resulting portions are applied to (i) the RX input port of first GSM duplexer 202 and (ii) UMTS BTS port 134-2 as UMTS uplink signal 135-2 of FIG. 1;
First GSM duplexer 202 filters the signal received from splitter 216 to generate GSM uplink signal 133-1 of FIG. 1 at GSM BTS port 132-1;
Antenna RX filter 218 passes combined GSM/UMTS uplink signal 141-2 to second RX amplifier 220;
The amplified output of second RX amplifier 220 is split by splitter 222 and the resulting portions are applied (i) to the RX input port of second GSM duplexer 204 and (ii) to UMTS BTS port 134-1 as UMTS uplink signal 135-1 of FIG. 1; and
Second GSM duplexer 204 filters the signal received from splitter 222 to generate GSM uplink signal 133-2 of FIG. 1 at GSM BTS port 132-2.

In one implementation of interface unit 200 of FIG. 2, hybrid combiner 206 is 3 dB combiner in which about half of the power of the two combined GSM downlink signals is lost during the combining process. This loss in downlink transmit power may adversely affect the ability of cell site 100 to support GSM communications.

Note that both UMTS and GSM uplink signals will be present at each of ports 132-1, 132-2, 134-1, and 134-2, where each of GSM BTS 110 and UMTS BTS 120 provides appropriate carrier filtering to process the desired uplink signals.

Figure 3:
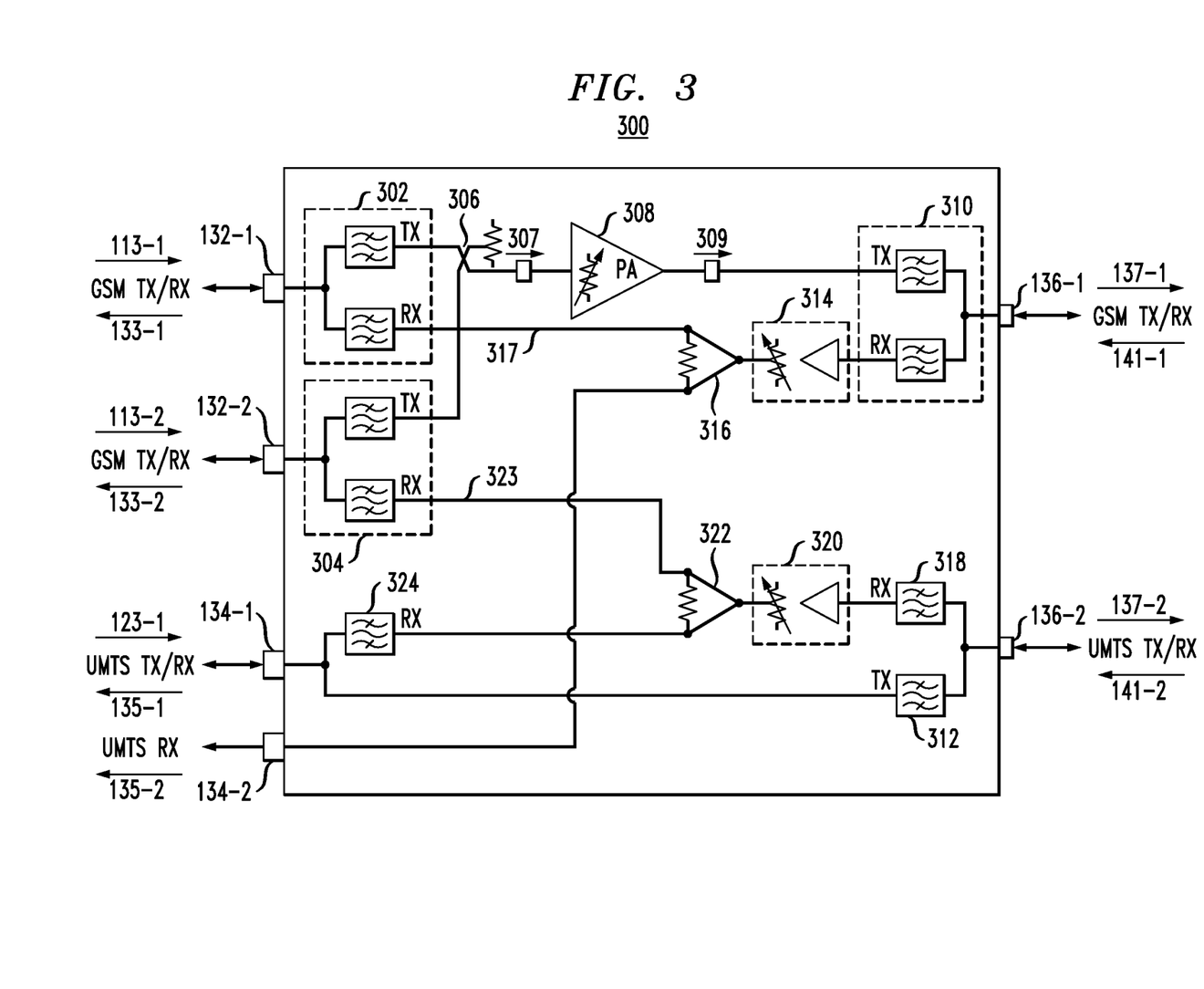
FIG. 3 shows a simplified block diagram of an interface unit that can be used for the interface unit of FIG. 1, according to one embodiment of the present invention.

FIG. 3 shows a simplified block diagram of an interface unit 300, which can be used for interface unit 130 of FIG. 1, according to one embodiment of the present invention. Interface unit 300 of FIG. 3 is similar to interface unit 200 of FIG. 2, with analogous elements having labels with the same last two digits. One difference between interface unit 300 of FIG. 3 and interface unit 200 of FIG. 2 is that interface unit 300 includes TX power amplifier system 308 coupled between the output of hybrid combiner 306 and the TX input port of antenna duplexer 310.

Operationally, interface unit 300 of FIG. 3 is also similar to interface unit 200 of FIG. 2, with analogous elements performing analogous functions. One difference between the operations of interface unit 300 of FIG. 3 and the operations of interface unit 200 of FIG. 2 is that TX power amplifier system 308 amplifies combined GSM downlink signal 307 to generate amplified combined GSM downlink signal 309, which is passed by antenna duplexer 310 to antenna port 136-1 as GSM downlink signal 137-1 of FIG. 1.

In the implementation of FIG. 3, splitter 316 is coupled to UMTS BTS port 134-2, while splitter 322 is coupled to UMTS BTS port 134-1. In an alternative implementation, splitter 316 may be coupled to UMTS BTS port 134-1, while splitter 322 may be coupled to UMTS BTS port 134-2.

Note that, in the embodiment of FIGS. 1 and 3, any diversity processing for the GSM uplink signals is performed within GSM BTS 110. In an alternative implementation, cross-connection of the two uplink signals 141-1 and 141-2 for GSM diversity processing could be performed within interface unit 300. In that case, signal 317 from splitter 316 would be split again prior to being applied to the RX filter of duplexer 302, with the other output from that additional splitting being passed via an additional dedicated path from interface unit 300 to GSM BTS 110. Similarly, signal 323 from splitter 322 would be split again prior to being applied to the RX filter of duplexer 304, with the other output from that other additional splitting being passed via another additional dedicated path from interface unit 300 to GSM BTS 110.

In the embodiment of interface unit 300 of FIG. 3, in the downlink direction, one antenna port (i.e., antenna port 136-1) is used exclusively for GSM downlink signals, while the other antenna port (i.e., antenna port 136-2) is used exclusively for UMTS downlink signals. In alternative embodiments of interface unit 130, that need not be the case. In particular, one or both antenna ports could each be used for both GSM and UMTS downlink signals. In that case, additional amplifiers and/or higher levels of amplification may be needed to compensate for signal power losses associated with combining the GSM and UMTS signals.

Furthermore, in this embodiment, interface unit 300 uses both antenna ports to support diversity RX operations for both GSM and UMTS uplink signals. In alternative embodiments of interface unit 300 that need not be the case. In particular, one or both antenna ports could each be used for only one of GSM and UMTS uplink signals. For example, interface unit 300 could be designed such that antenna ports 136-1 and 136-2 support RX operations for GSM signals, while only antenna port 136-2 supports RX operations for UMTS signals. As another example, interface unit 300 could be designed such that only antenna port 136-1 supports RX operations for GSM signals, while only antenna port 136-2 supports RX operations for UMTS signals.

In one implementation of interface unit 300, hybrid combiner 306 is 3 dB combiner in which about half of the power of the two combined GSM downlink signals is lost during the combining process, and power amplifier system 308 is designed to compensate for the 3 dB power loss during that combining process before the combined downlink signal is applied to antenna port 136-1. In that case, the total GSM downlink transmit power level of cell site 100 of FIG. 1 can be the same as the total GSM downlink transmit power level of the corresponding GSM-only cell site, without having to modify the GSM BTS or the antennas.

Note that, in alternative implementations, hybrid combiner 306 may be other than a 3 dB combiner and/or power amplifier system 308 may generate an amplified combined GSM downlink signal 309 having a power level that is less than, greater than, or equal to the sum of the power levels of the two GSM downlink signals applied to combiner 306.

Figure 4:
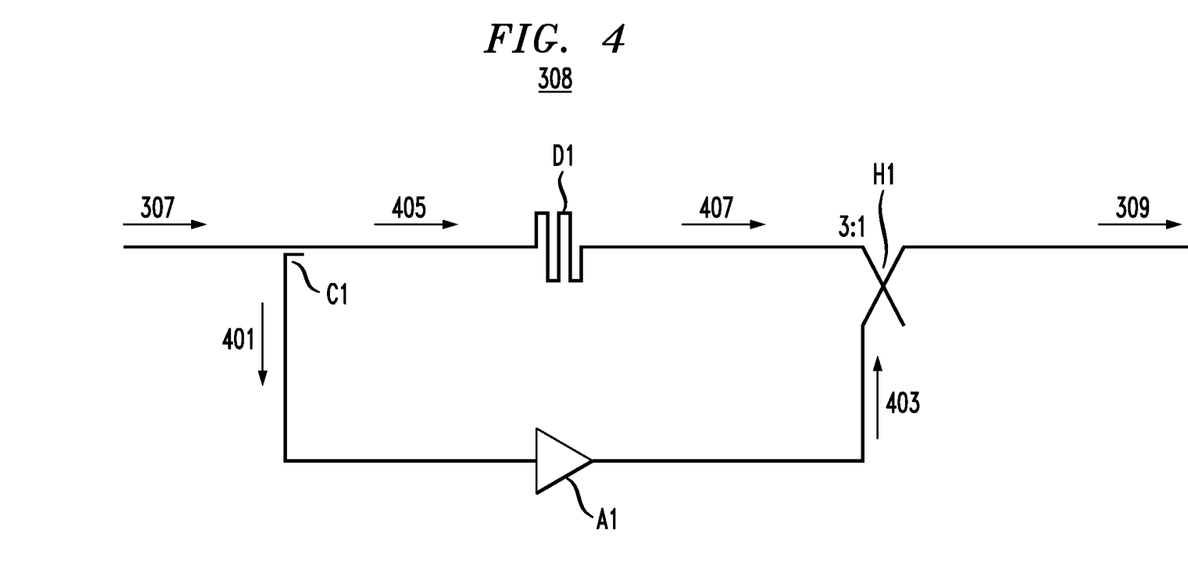
FIG. 4 shows a simplified schematic diagram of the TX power amplifier system of FIG. 3, according to one embodiment of the present invention.

FIG. 4 shows a simplified schematic diagram of TX power amplifier system 308 of FIG. 3, according to one embodiment of the present invention. As shown in FIG. 4, TX power amplifier system 308 comprises tap C1 (for example, a directional coupler), delay filter D1, linearized amplifier A1, and hybrid combiner H1.

Operationally, tap C1 taps off a portion of GSM downlink signal 307 of FIG. 3 as tap signal 401, which is amplified by linearized amplifier A1 to generate amplified signal 403. The untapped remainder 405 of combined GSM downlink signal 307 is delayed by delay filter D1. As used herein, the term "delay filter" refers to a broadband filter, a transmission line, or any other suitable structure for appropriately delaying an applied signal without significantly altering other characteristics of the signal.

Hybrid combiner H1 combines amplified signal 403 from linearized amplifier A1 and delayed signal 407 from delay filter D1 to generate amplified GSM downlink signal 309 of FIG. 3. The purpose of delay filter D1 is to compensate for the processing delay of tap signal 401 through linearized amplifier A1, such that the two resulting signals are synchronized at hybrid combiner H1.

In one possible implementation, tap C1 is an approximately −10 dB coupler that taps off about 10% of the power of GSM downlink signal 307 as tap signal 401, and linearized amplifier A1 applies a gain of about 13 dB, such that hybrid combiner H1 is a 3:1 combiner where about 75% of the power in amplified GSM downlink signal 309 comes from amplified signal 403 and about 25% of the power comes from delayed signal 407. These values take into account losses in tap C1, delay filter D1, and hybrid combiner H1. In such an implementation, the power level of amplified GSM downlink signal 309 is about twice the power level of GSM downlink signal 307. In other implementations, other values for tap C1 and linearized amplifier A1 are possible.

The amplifier architecture shown in FIG. 4 provides advantages over other possible amplifier architectures for power amplifier system 308 of FIG. 3. One other possible architecture would have all of GSM downlink signal 307 applied to a linearized amplifier, analogous to linearized amplifier A1, to generate amplified GSM downlink signal 309. In addition to having to supply all of the output power, such a linearized amplifier would have to compensate for distortion associated with the full output power level. On the other hand, in the architecture of FIG. 4, linearized amplifier A1 has to compensate for distortion associated with less than (e.g., only 75% of) the full output power level, where delayed signal 407 (representing, for example, 25% of the full output power level) has minimal distortion.

Another possible amplifier architecture for power amplifier system 308 of FIG. 3 would be based on a distributed amplifier scheme, such as that taught in U.S. Pat. No. 3,571,742, the teachings of which are incorporated herein by reference in their entirety, having a plurality of amplifier legs connected in parallel between a tapped input signal line and a coupled output signal line. Such a distributed amplifier scheme includes a dummy load at the end of the input signal line, which dumps any remaining power in the input signal line. In the architecture of FIG. 4, on the other hand, no input signal power is lost to a dummy load, because the untapped remainder of the input signal is delayed and added to the amplified tapped signal to generate the output signal.

Another significant difference between the amplifier system of the present invention shown in FIG. 4 and a distributed amplifier such as that shown in U.S. Pat. No. 3,571,742 is the use of a hybrid combiner at the output of amplifier A1 in FIG. 4. In the distributed amplifier, the output of each amplification stage is coupled to the output transmission line either inductively or capacitively or using a combination of the two in a manner that preserves the characteristic impedance of the transmission line. This form of coupling imposes a severe restriction on the coupling ratio, whereas the hybrid coupling scheme shown in FIG. 4 allows a relatively wide range of coupling ratios and amplifier gains to be employed.

Figure 5:
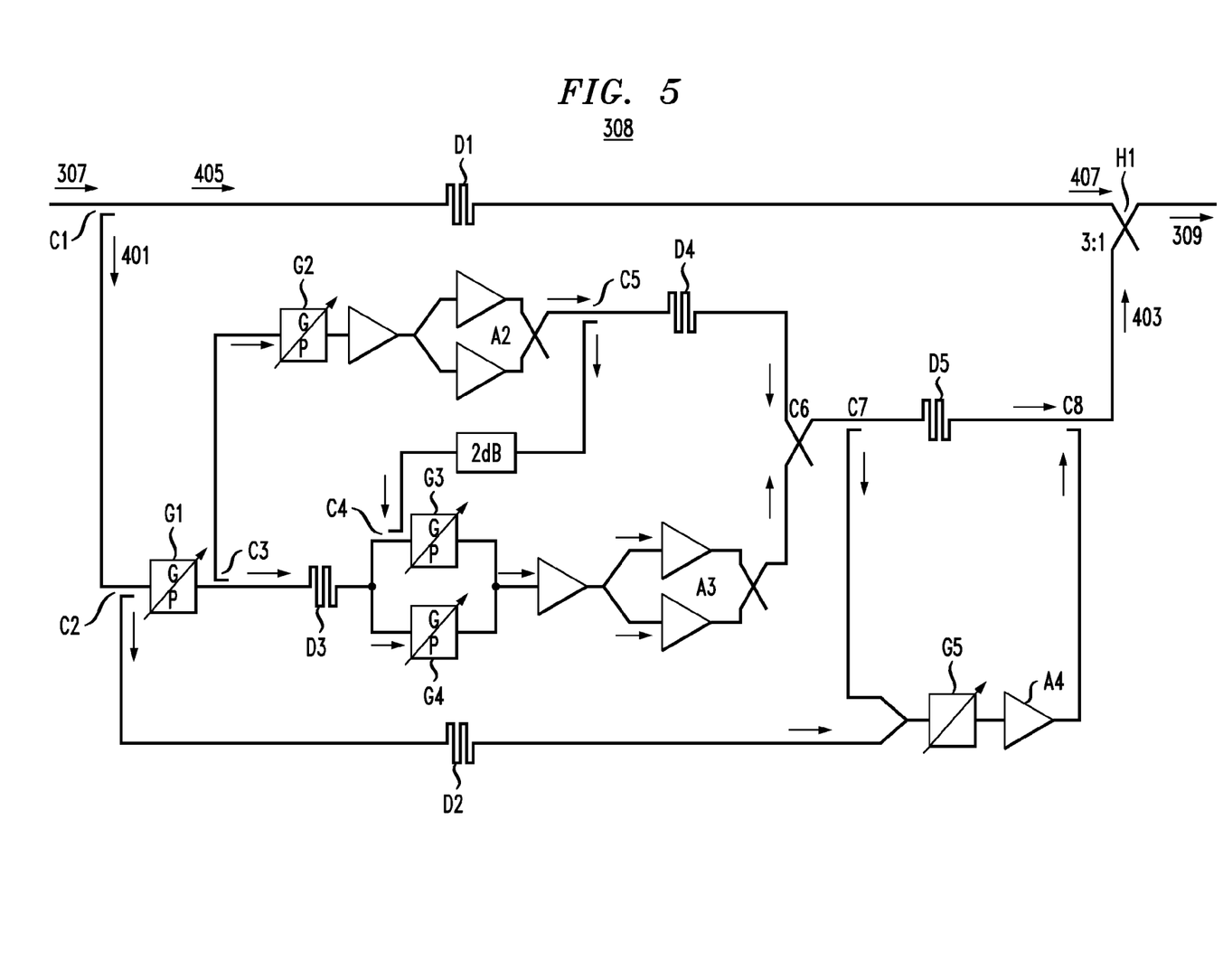
FIG. 5 shows a more-detailed schematic diagram of the TX power amplifier system of FIG. 3, according to one implementation of the present invention.

FIG. 5 shows a more-detailed schematic diagram of TX power amplifier system 308 of FIG. 3, according to one implementation of the present invention. FIG. 5 shows tap C1, delay filter D1, and hybrid combiner H1 of FIG. 4, along with their corresponding input and output signals 307, 401, 403, 405, 407, and 309. As indicated by the label "A1", the rest of the circuitry shown in FIG. 5 corresponds to one possible implementation of linearized amplifier A1 of FIG. 4 that uses both cross-cancellation and feed-forward techniques to minimize distortion in amplified GSM downlink signal 309.

In particular, in FIG. 5, Doherty amplifiers A2 and A3 are configured to provide cross-cancellation, while amplifier A4 provides feed-forward distortion compensation. As indicated in FIG. 5:

- A portion of tap signal 401 of FIG. 4 is tapped at tap C2 and forwarded to feed-forward amplifier A4 via delay filter D2 and amplitude/phase adjuster G5;
- The untapped remainder of tap signal 401 is adjusted at amplitude/phase adjuster G1 and then split at tap C3;
- A portion of the signal split at tap C3 is adjusted by amplitude/phase adjuster G2 and then amplified by Doherty amplifier A2;
- The other portion of the signal split at tap C3 is delayed at delay filter D3, split for adjustment by parallel amplitude/phase adjusters G3 and G4, and recombined for amplification by Doherty amplifier A3. Parallel adjusters G3 and G4 enable independent control over the carrier and distortion signals;

A portion of the signal from amplifier A2 is tapped at tap C5 and subtracted at coupler C4 from the signal applied to adjuster G3 to provide cross-cancellation between amplifier A2 and amplifier A3;

The untapped remainder of the signal from amplifier A2 is delayed by delay filter D4 and then added to the signal from amplifier A3 at combiner C6;

A portion of the signal from combiner C6 is tapped at tap C7 and subtracted from the signal from delay filter D2 to generate the feed-forward signal applied to adjuster G5 and amplifier A4;

The untapped remainder of the signal from combiner C6 is delayed by delay filter D5 and applied to combiner C8, which subtracts the feed-forward distortion compensation signal from amplifier A4 to generate amplified signal 403 of FIG. 4.

In an exemplary implementation of TX power amplifier system 308 of FIG. 5:

Tap C1 taps off about 10% of input signal 307 as tap signal 401;
Delay filter D1 delays signal 405 by about 30 ns;
Tap C2 taps off about 10% of tap signal 401 for application to delay filter D2;
Delay filter D2 applies a delay of about 20 ns;
Amplifier A4 applies a gain of about 10 dB;
Tap C3 is an approximately −10 dB coupler, with the greater signal going to delay filter D3;
Delay filter D3 applies a delay of about 10 ns;
Amplifier A3 applies a gain of about 10 dB;
Amplifier A2 applies a gain of about 10 dB;
Tap C5 taps off about 10% of the signal from amplifier A2;
Delay filter D4 applies a delay of about 10 ns;
Combiner C6 is a 3 db combiner;
Tap C7 taps about 10% of the signal from combiner C6;
Delay filter D5 applies a delay of about 10 ns; and
Combiner H1 is a 3:1 hybrid combiner.

Although combiner H1 has been described as being a 3:1 hybrid combiner, that ratio will be different for embodiments having a different ratio of power between amplified signal 403 and delayed signal 407.

Figure 6:
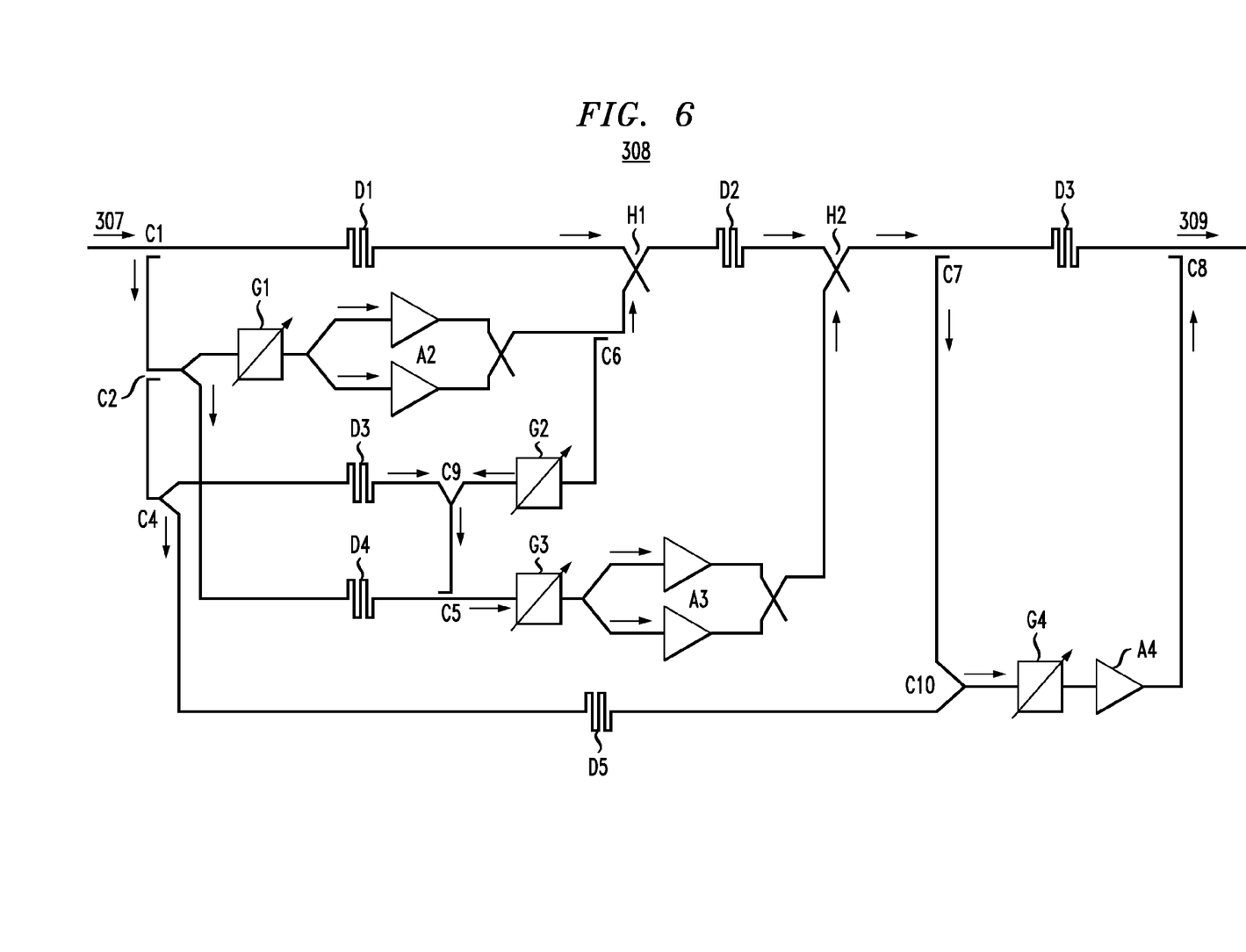
FIG. 6 shows a more-detailed schematic diagram of the TX power amplifier system of FIG. 3, according to another implementation of the present invention.

FIG. 6 shows a more-detailed schematic diagram of TX power amplifier system 308 of FIG. 3, according to another implementation of the present invention. Like the implementation of FIG. 5, this implementation of TX power amplifier system 308 is a low-gain booster amplifier having Doherty amplifier stages A2 and A3 in a cross-cancellation configuration, with amplifier A4 providing feed-forward distortion compensation. As in FIG. 5, an untapped portion of GSM downlink signal 307 is delayed and combined with an amplified tapped portion to generate amplified GSM downlink signal 309, with about 25% of the total output power coming from the delayed, untapped portion.

As in FIG. 5, a portion of GSM downlink signal 307 is coupled off from the delay line and amplified by amplifiers A2, A3, and A4. Amplifier A2 adds power through hybrid combiner H1 to the input power. Amplitude/phase adjuster G1 adjusts the amplitude and phase of its received signal to ensure that the addition of signals at combiner H1 is coherent (i.e., the two received signals are in phase and have the same amplitude). In a similar manner, amplifier A3 and hybrid combiner H2 again increase the signal power along the main line. In one implementation, taps C1 and C2 are approximately −10 dB couplers and taps C3 and C4 are both 50/50 splitters, amplifier A2 applies a gain of about 10 dB, and amplifier A3 applies a gain of about 13 dB, such that TX power amplifier system 308 of FIG. 6 provides an overall gain of about 3 dB.

Couplers C6 and C5, delay filters D3 and D4, and amplitude/phase adjuster G2 create a cross-cancellation loop that improves linearity. A small portion of the signal generated by amplifier A2 is tapped off by coupler C6, adjusted by adjuster G2, and subtracted at coupler C9 from the delayed signal from delay filter D3 such that only distortion, e.g., from amplifier A2, remains. This distortion signal is then subtracted from the signal applied to amplifier A3 to pre-compensate for distortion generated by amplifiers A2 and A3.

To further improve linearity of TX power amplifier system 308, like the embodiment of FIG. 5, the embodiment of FIG. 6 includes a feed-forward loop. In particular, a portion of the signal tapped by tap C1 is further tapped at tap C2 and splitter C4 and then delayed by delay filter D5. In addition, a portion of the output signal from combiner H2 is tapped at coupler C7 and subtracted at coupler C10 from the delayed signal from delay filter D5. What remains is a distortion signal that is adjusted by amplitude/phase adjuster G4 and amplified by feed-forward amplifier A4 to generate a feed-forward distortion signal that is subtracted at coupler C8 from the amplified signal from delay filter D3 to further reduce distortion in amplified GSM downlink signal 309.

Although the present invention has been described in the context of TX power amplifier system 308 having amplifier A1 implemented with both cross-cancellation and feed-forward distortion compensation, the invention is not so limited. In general, amplifier A1 can be implemented with any one or more suitable types of distortion compensation, including, but not limited to, cross-cancellation distortion compensation, feed-forward distortion compensation, and pre-distortion compensation.

The present invention has been described in the context of a cell site that supports both GSM and UMTS communications. Such a cell site can be originally configured for both GSM and UMTS communications. Alternatively, an existing GSM cell site can be upgraded based on the present invention to support UMTS communications as well as GSM communications. Similarly, an existing UMTS cell site can be upgraded based on the present invention to support GSM communications as well as UMTS communications. Moreover, the present invention can be implemented in the context of cell sites that support any two or more different wireless communications standards, whether or not those standards include GSM and/or UMTS.

Another way of characterizing the context of the present invention described previously is in terms of the number of different sets of downlink/uplink signals being handled. For example, upgrading a GSM cell site that supports two different sets of GSM downlink/uplink signals to support, in addition, a set of UMTS downlink/uplink signals can be characterized as upgrading a cell site that supports two different sets of downlink/uplink signals to support, in addition, a third set of downlink/uplink signals. This characterization applies whether the different signals conform to different communications standards or the same communications standard.

Thus, for example, the present invention can be implemented in the context of upgrading a cell site that supports two different sets of GSM downlink/uplink signals to support three different sets of GSM downlink/uplink signals. In general, the present invention can be implemented in the context of either upgrading an existing cell site or providing a new cell site, where the upgraded/new cell site supports three (or more) different sets of downlink/uplink signals. Note that, in the context of upgrading an existing cell site that supports first and second sets of downlink/uplink signals to be an upgraded cell site that supports first, second, and third sets of downlink/uplink signals, where two of the three downlink signals are combined and amplified for transmission from a single antenna, the two downlink signals that are combined need not be limited to the two original downlink signals. In other words, the new downlink signal could be combined with one of the original downlink signals, with the other original downlink signal being transmitted from a different antenna.

The present invention has been described in the context of two antennas of a cell site. Depending on the implementation, those two antennas may correspond to only one sector of a cell site having multiple sectors, each sector having its own pair of antennas. Alternatively, the two antennas may correspond to the entire cell site, in which case, the entire cell site may be referred to as a unitary sector. In general, the present invention can be implemented in the context of cell sites having any number of antennas per sector, including a single antenna per sector.

TX power amplifier system 308 of FIG. 3 is designed to restore the transmit power lost in hybrid combiner 306. In one implementation in which approximately half of the transmit power is lost in combiner 306, amplifier system 308 has a gain of about two. The architecture of amplifier system 308 shown in FIG. 4 is particularly suitable for such a relatively low gain level. Those skilled in the art will appreciate that the architecture of FIG. 4 will also be suitable for other amplifier applications having similar relatively low gain levels. Furthermore, although some of the advantages diminish with increased gain, in theory, the architecture of FIG. 4 can be applied to any amplifier gain level.

Certain embodiments of the present invention may be implemented as analog circuit-based processes, including possible implementation as a single integrated circuit (such as an ASIC), a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

As used herein in reference to an element and a standard, the term "conform" means that the element communicates with other elements in a manner wholly or partially specified by the standard, and would be recognized by other elements as sufficiently capable of communicating with the other elements in the manner specified by the standard. The conforming element does not need to operate internally in a manner specified by the standard.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

What is claimed is:

1. Apparatus having an amplifier system comprising:
   a tap adapted to split an amplifier input signal into a tapped signal and an untapped signal;
   an all-pass delay filter adapted to delay the untapped signal to generate an undivided, full-bandwidth, delayed version of the amplifier input signal;
   an amplifier adapted to amplify the tapped signal to generate an undivided amplified version of the amplifier input signal, wherein the undivided amplified version of the amplifier input signal is in phase with the undivided, full-bandwidth, delayed version of the amplifier input signal; and
   a combiner adapted to coherently add the undivided, full-bandwidth, delayed version of the amplifier input signal and the undivided amplified version of the amplifier input signal to generate an amplified output signal having a power dependent upon the sum of the powers of the undivided, full-bandwidth, delayed version and the undivided amplified version of the amplifier input signal, wherein the amplifier is a linearized amplifier that comprises:
   a phase shifter;
   first and second amplifiers connected in a cross cancellation configuration; and
   a third amplifier connected to provide feed forward distortion compensation for the first and second amplifiers.

2. A method for upgrading an existing cell site that supports communications of two different sets of downlink/uplink signals to be an upgraded cell site that supports communications of at least three different sets of downlink/uplink signals, wherein the existing cell site applies (i) a first downlink signal to a first antenna of the existing cell site and (ii) a second downlink signal to a second antenna of the existing cell site, the method comprising:
   (a) configuring the cell site to generate a third downlink signal; and
   (b) configuring the cell site with an interface unit comprising:

a combiner adapted to combine two of the downlink signals to generate a combined downlink signal; and an amplifier system adapted to amplify the combined downlink signal to generate an amplified combined downlink signal, wherein:

the interface unit is connected to apply (i) the amplified combined downlink signal to the first antenna and (ii) a remaining downlink signal to the second antenna; and the amplifier system comprises:

a tap adapted to split the combined downlink signal into a tapped signal and an untapped signal;

an all-pass delay filter adapted to delay the untapped signal to generate an undivided, full-bandwidth, delayed version of the amplifier input signal;

an amplifier adapted to amplify the tapped signal to generate an undivided amplified version of the amplifier input signal, wherein the undivided amplified version of the amplifier input signal is in phase with the undivided, full-bandwidth, delayed version of the amplifier input signal, wherein the amplifier comprises:

first and second amplifiers connected in a cross cancellation configuration; and a third amplifier connected to provide feed forward distortion compensation; and a combiner adapted to coherently add the undivided, full-bandwidth, delayed version of the amplifier input signal and the undivided amplified version of the amplifier input signal to generate the amplified combined downlink signal having a power dependent upon the sum of the powers of the undivided, full-bandwidth, delayed version and the undivided amplified version of the amplifier input signal.

3. The method of claim 2, wherein:

the existing cell site is a GSM cell site having a GSM BTS;

the first and second downlink signals are two different GSM downlink signals generated by the GSM BTS;

step (a) comprises configuring the cell site with a UMTS BTS; and the third downlink signal is a UMTS downlink signal generated by the UMTS BTS.

4. The method of claim 2, wherein:

the tap is an approximately −10 dB coupler;

the amplifier system applies a gain of about 13 dB; and the combiner is a 3:1 combiner, such that the amplified combined downlink signal's power level is about twice the combined downlink signal's power level.

5. A cell site comprising an interface unit connected to one or more BTSs and at least first and second antennas, wherein the interface unit comprises:

a combiner adapted to combine first and second downlink signals received from the one or more BTSs to generate a combined downlink signal; and an amplifier system adapted to amplify the combined downlink signal to generate an amplified combined downlink signal, wherein:

the interface unit is connected to apply (i) the amplified combined downlink signal to the first antenna and (ii) a third downlink signal received from the one or more BTSs to the second antenna; and the amplifier system comprises:

a tap adapted to split the combined downlink signal into a tapped signal and an untapped signal;

an all-pass delay filter adapted to delay the untapped signal to generate an undivided, full-bandwidth, delayed version of the amplifier input signal;

an amplifier adapted to amplify the tapped signal to generate an undivided amplified version of the amplifier input signal, wherein the undivided amplified version of the amplifier input signal is in phase with the undivided, full-bandwidth, delayed version of the amplifier input signal, wherein the amplifier is a linearized amplifier comprising:

a phase shifter;

first and second amplifiers connected in a cross cancellation configuration; and a third amplifier connected to provide feed forward distortion compensation for the first and second amplifiers; and a combiner adapted to coherently add the undivided, full-bandwidth, delayed version of the amplifier input signal and the undivided amplified version of the amplifier input signal to generate the amplified combined downlink signal having a power dependent upon the sum of the powers of the undivided, full-bandwidth, delayed version and the undivided amplified version of the amplifier input signal.

6. The cell site of claim 5, wherein:

the one or more BTSs comprise a GSM BTS and a UMTS BTS;

the first and second downlink signals are two different GSM downlink signals generated by the GSM BTS; and the third downlink signal is a UMTS downlink signal generated by the UMTS BTS.

7. The cell site of claim 5, wherein:

the tap is an approximately −10 dB coupler;

the amplifier system applies a gain of about 13 dB; and the combiner is a 3:1 combiner, such that the amplified combined downlink signal's power level is about twice the combined downlink signal's power level.

8. Apparatus having an amplifier system comprising:

a tap adapted to split an amplifier input signal into a tapped signal and an untapped signal;

a delay filter adapted to delay the untapped signal to generate a delayed version of the amplifier input signal;

an amplifier adapted to amplify the tapped signal to generate an amplified version of the amplifier input signal, wherein the amplified version of the amplifier input signal is in phase with the delayed version of the amplifier input signal; and a combiner adapted to coherently add the delayed version of the amplifier input signal and the amplified version of the amplifier input signal to generate an amplified output signal having a power dependent upon the sum of the powers of the delayed version and the amplified version of the amplifier input signal, wherein:

the tap is an approximately −10 dB coupler;

the amplifier applies a gain of about 13 dB; and the combiner is a 3:1 combiner, such that the amplified output signal's power level is about twice the input signal's power level, when losses in the tap, the delay filter, and the combiner are taken into account.

9. The apparatus of claim 8, wherein the amplifier is a linearized amplifier that includes a phase shifter.

10. The apparatus of claim 9, wherein the linearized amplifier comprises:

first and second amplifiers connected in a cross cancellation configuration; and a third amplifier connected to provide feed forward distortion compensation for the first and second amplifiers.

11. Apparatus having an amplifier system comprising:
a tap adapted to split an amplifier input signal into a tapped signal and an untapped signal;
a delay filter adapted to delay the untapped signal to generate a delayed version of the amplifier input signal;
an amplifier adapted to amplify the tapped signal to generate an amplified version of the amplifier input signal, wherein the amplified version of the amplifier input signal is in phase with the delayed version of the amplifier input signal; and
a combiner adapted to coherently add the delayed version of the amplifier input signal and the amplified version of the amplifier input signal to generate an amplified output signal having a power dependent upon the sum of the powers of the delayed version and the amplified version of the amplifier input signal, wherein the amplifier is a linearized amplifier comprises:
a phase shifter;
first and second amplifiers connected in a cross cancellation configuration; and
a third amplifier connected to provide feed forward distortion compensation for the first and second amplifiers.

12. The apparatus of claim 11, wherein:
the tap is an approximately −10 dB coupler;
the amplifier applies a gain of about 13 dB; and
the combiner is a 3:1 combiner, such that the amplified output signal's power level is about twice the input signal's power level, when losses in the tap, the delay filter, and the combiner are taken into account.

13. The apparatus of claim 11, wherein the amplifier system is part of an interface unit for a cell site, the interface unit comprising (i) one or more base transceiver station (BTS) ports adapted to be connected to one or more BTSs and (ii) one or more antenna ports adapted to be connected to one or more antennas.

14. The apparatus of claim 13, wherein the interface unit comprises:
two GSM BTS ports adapted to be connected to a GSM BTS;
two UMTS BTS ports adapted to be connected to a UMTS BTS; and
two antenna ports adapted to be connected to two antennas.

15. The apparatus of claim 14, wherein the interface unit further comprises a combiner adapted to combine two GSM downlink signals received from the GSM BTS at the two GSM BTS ports to generate a combined GSM downlink signal as the amplifier input signal, where the amplifier system is adapted to amplify the combined GSM downlink signal to generate an amplified combined GSM downlink signal as the amplified output signal.

16. The apparatus of claim 15, wherein the interface unit is adapted to apply the amplified combined GSM downlink signal to one of the antenna ports for radiation by one of the antennas.

17. The apparatus of claim 13, wherein the apparatus comprises the interface unit.

18. The apparatus of claim 17, wherein the apparatus further comprises the one or more BTSs and the one or more antennas.

\* \* \* \* \*